United States Patent [19]

Svager

[11] Patent Number: 4,593,212
[45] Date of Patent: Jun. 3, 1986

[54] TTL TO CMOS INPUT BUFFER

[75] Inventor: Yehuda Svager, Raanana, Israel

[73] Assignee: Motorola, Inc., Schaumburg, Ill.

[21] Appl. No.: 687,042

[22] Filed: Dec. 28, 1984

[51] Int. Cl.[4] .................. H03K 19/017; H03K 3/037; H03K 19/094; H03K 19/003

[52] U.S. Cl. .................................. 307/475; 307/443; 307/585; 307/279

[58] Field of Search .............. 307/443, 451, 475, 448, 307/264, 279, 290, 585, 584

[56] References Cited

U.S. PATENT DOCUMENTS

| | | | |
|---|---|---|---|
| 4,039,862 | 8/1977 | Dingwall et al. | 307/475 X |
| 4,295,065 | 10/1981 | Hsieh et al. | 307/475 |
| 4,380,710 | 4/1983 | Cohen et al. | 307/451 X |
| 4,472,647 | 9/1984 | Allgood et al. | 307/475 |
| 4,475,050 | 10/1984 | Noufer | 307/475 |
| 4,490,633 | 12/1984 | Noufer et al. | 307/451 X |
| 4,501,978 | 2/1985 | Gentile et al. | 307/443 X |
| 4,504,747 | 3/1985 | Smith et al. | 307/475 |

FOREIGN PATENT DOCUMENTS 100541  6/1983  Japan .................... 307/475

*Primary Examiner*—Larry N. Anagnos
*Attorney, Agent, or Firm*—Anthony J. Sarli, Jr.; Jeffrey V. Myers; James L. Clingan, Jr.

[57] ABSTRACT

A TTL to CMOS input buffer has a CMOS inverter for receiving the TTL signal on its input. The inverter has a P channel transistor coupled between VDD and the output of the inverter, which has relatively low gain so that there is very little current flow through the inverter when the TTL signal is at low voltage logic high. A switch is coupled between VDD and the output of the inverter. The switch couples VDD to the output of the inverter in response to the TTL signal switching from a logic high to a logic low.

8 Claims, 1 Drawing Figure

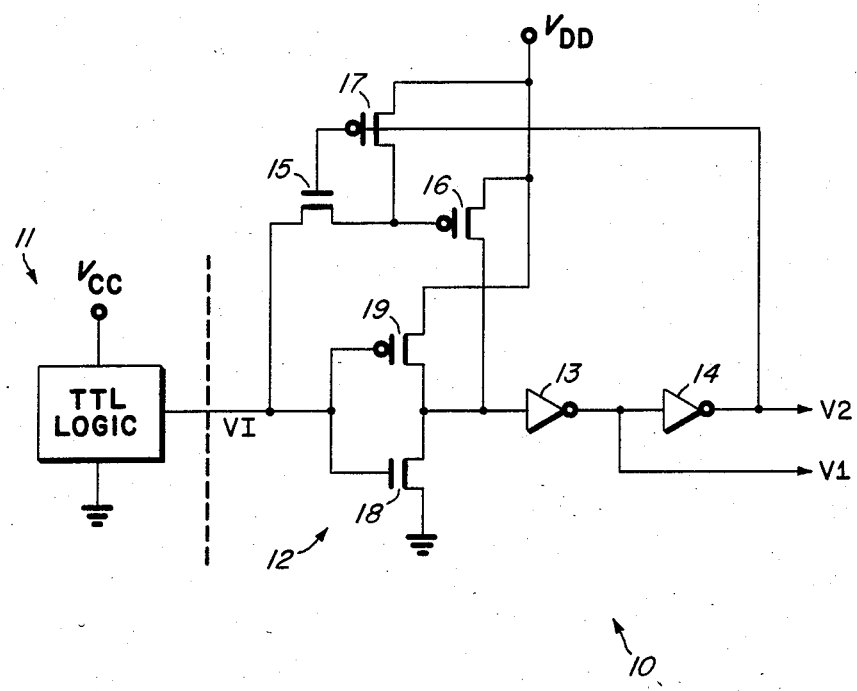

TTL TO CMOS INPUT BUFFER

FIELD OF THE INVENTION

The invention relates to input buffers, and more particularly, to low power CMOS input buffers which receive TTL signals.

BACKGROUND OF THE INVENTION

In CMOS technology a P channel insulated gate field effect transistor (IGFET) is in series with an N channel IGFET between a positive and a negative power supply terminal so that one of the two transistors is always off in a static condition to prevent current from flowing between the two power supply terminals in the static condition. This provides for very low power consumption which is the typical reason for using CMOS. Another commonly used technology is TTL. Integrated circuits using CMOS are frequently required to interface with integrated circuits using TTL. A TTL output can be as low as 2.0 volts for a logic high. A logic high as an input to a CMOS circuit should result in the P channel transistor being non-conducting, but with an input of 2.0 volts for a 5 volt system, the P channel will be conducting. This is a problem because there is then a current path from the P channel transistor through the N channel transistor because the N channel transistor is also conducting.

SUMMARY OF THE INVENTION

An object of the invention is to provide an improved TTL to CMOS input buffer.

Another object of the invention is to provide a TTL to CMOS input buffer with reduced power consumption.

Yet another object of the invention is to provide a TTL to CMOS input buffer with reduced speed.

These and other objects of the invention are achieved in a TTL to CMOS input buffer which has a P channel and an N channel transistor coupled in series between first and second power supply terminals. Both transistors have a control electrode for receiving a TTL signal. A supply coupling circuit is coupled between the first power supply terminal and the connection between the two transistors. The supply coupling means couples the first power supply terminal to the connection between the two transistors when the TTL signal switches from a logic high to a logic low.

BRIEF DESCRIPTION OF THE DRAWINGS

The FIGURE is a circuit diagram of a TTL to CMOS input buffer according to a preferred embodiment of the invention.

DESCRIPTION OF THE INVENTION

Shown in the sole FIGURE is a TTL to CMOS input buffer 10 for providing an output in response to receiving a TTL signal VI from a TTL logic circuit 11, which is coupled between a TTL positive power supply terminal, VCC of nominally 5 volts, and ground. Input buffer 10 comprises a CMOS inverter 12, a CMOS inverter 13, a CMOS inverter 14, an N channel transistor 15, a P channel transistor 16, and a P channel transistor 17. Inverter 12 comprises an N channel transistor 18, and a P channel transistor 19. The N channel transistors have a nominal threshold voltage of 0.8 volt. The P channel transistors have a nominal threshold voltage of −0.8 volt.

Transistor 18 has a gate for receiving TTL signal VI, a source connected to ground, and a drain. Transistor 19 has a gate connected to the gate of transistor 18, a source connected to a CMOS positive power terminal which receives a nominal voltage of 5.0 volts, and a drain connected to the drain of transistor 18. The gates of transistors 18 and 19 serve as an input of inverter 12. The drains of transistors 18 and 19 serve as an output of inverter 12. Inverter 13 has an input connected to the output of inverter 12, and an output for providing an output signal V1. Inverter 14 has an input connected to the output of inverter 13, and an output for providing an output signal V2 which is complementary to signal V1.

Transistor 15 has a first current electrode connected to the gate of transistor 18, a control electrode connected to the output of inverter 14, and a second current electrode. Transistor 15 is used in a manner to take advantage of the bilateral nature of IGFETs. The first and second current electrodes each can function as a source or a drain. Transistor 17 has a source connected to VDD, a gate connected to the output of inverter 14, and a drain connected to the second current electrode of transistor 15. Transistor 16 has a source connected to VDD, a gate connected to the second current electrode of transistor 15, and a drain connected to the output of inverter 12.

Inverters 12-14 are responsive to input signal VI. When signal VI is a logic low, inverter 12 provides a logic high output, inverter 13 provides signal V1 at a logic low, and inverter 14 provides signal V2 at a logic high. When signal VI is a logic high, inverter 12 provides a logic low output, inverter 13 provides signal V1 at a logic high, and inverter 14 provides signal V2 at a logic low. Transistors 15-17 provide feedback from inverter 14. The worst case example for wasted current flow is for the case in which signal VI is to be recognized as a logic high but is only 2.0 volts. When signal VI is 2.0 volts, both transistors 18 and 19 are conducting so that there is static current flow from VDD to ground through transistors 18 and 19. This current is minimized by making transistor 19 have relatively low gain. Transistor 18 is made to be of relatively high gain so that the output of inverter 12 is a logic low at near ground when signal VI is only 2.0 volts. Inverter 13 then provides signal V1 at a logic high at VDD. Inverter 14 then provides signal V2 at a logic low which causes transistor 15 to be non-conducting and transistor 17 to be conducting. Transistor 17 couples the voltage at VDD to the gate of transistor 16 to ensure that transistor 16 is non-conducting. Consequently, in the situation in which VI is a logic high at only 2.0 volts, the only current flow in input buffer 10 is that through transistors 19 and 18 which is very limited because of the low gain of transistor 19. If signal VI is higher than 2.0 volts the current is further reduced. If the voltage of signal VI is high enough to keep transistor 19 from conducting, there are then no static current paths for input buffer 10.

When input signal VI switches to a logic low, transistor 18 becomes non-conducting so that the voltage at the output of inverter 12 begins rising. After the output of inverter 12 reaches a certain level, inverter 13 will begin reducing the voltage level of signal V1 which will then cause inverter 14 to increase the voltage level of signal V2. When signal V2 exceeds the input voltage VI by the threshold voltage of transistor 15, transistor 15 will become conductive so that the voltage at the gate of transistor 16 is reduced. This causes transistor 16 to become conductive, so that transistor 16 then causes the output of inverter 12 to rapidly reach the voltage at VDD. Transistor 17 becomes less conductive as a result of the rise in voltage of signal V2. By coupling the logic low of input signal VI to the gate of transistor 16, the output of inverter 12 reaches the voltage at VDD much faster. This in turn causes signal V1 to reach ground sooner and signal V2 to reach the voltage at VDD sooner. Also, while the output of inverter 12 is between VDD and ground, inverter 13 has a current path from VDD to ground so that power is wasted during this time period. Consequently, the time period that such power is wasted is reduced by transistor 16 coupling VDD to the output of inverter 12. In the static state of buffer 10 for signal VI at a logic low, inverter 12 provides a logic high output of VDD, inverter 13 provides signal V1 at a logic low at ground potential, inverter 14 provides signal V2 at a logic high of VDD, transistor 17 is non-conducting, transistor 15 couples the logic low of signal VI to gate of transistor 16, and transistor 16 couples VDD to the output of inverter 12 as well as the input of inverter 13. Consequently, there are no static current paths when signal VI is a logic low which is the desired result.

When signal VI switches from a logic low to a logic high, transistor 18 becomes conductive, reducing the voltage at the output of inverter 12. Assuming, the worst case condition that signal VI only switches to 2.0 volts, transistor 18 remains conductive but is somewhat reduced in conductivity. The same is true for transistor 16 which receives the increased voltage of signal VI, so that the conductivity of transistor 16 is reduced. The output of inverter 12 increases sufficiently to cause inverter 13 to provide signal VI at a sufficiently high level to cause inverter 14 to provide signal V2 at a sufficiently low level to cause transistor 17 to raise the voltage at the gate of transistor 16 as well as to reduce the conductivity of transistor 15. As the gate voltage of transistor 16 rises, transistor 16 becomes less conductive so that the output of inverter 12 is further reduced. The further reduction of the voltage of the output of inverter 12 causes inverter to provide signal V1 at a higher voltage until signal V1 is at the voltage at VDD. Likewise, inverter 14 responds to signal V1 by providing signal V2 at a reduced voltage until signal V2 is at ground potential. Signal V2 at ground potential ensures that transistor 15 is non-conducting and that transistor 17 couples VDD to the gate of transistor 16 which in turn ensures that transistor 16 is non-conducting. This results in the only static current path being through transistors 18 and 19.

Input buffer 10 thus provides the desired functionality of an input buffer while consuming very little static power. The worst case for static power loss occurs when signal VI is a logic high at 2.0 volts. In such a case transistor 19 is conductive when it is desirable to be non-conductive. The adverse effect of transistor 19 being conductive is reduced by having transistor 19 be relatively low gain. The problem of transistor 19 being low gain is that inverter 12 then has a relatively slow response time to a logic high to logic low transition of signal VI. Compensation for the slow response time of inverter 12 is achieved by causing transistor 16 to couple VDD to the output of inverter 12 in response to this logic high to logic low transition of signal VI. Transistor 16 is made conductive by coupling signal VI to the gate of transistor 16 in response to feedback provided via inverters 13 and 14 which act as an amplifier having an input coupled to the output of inverter 12 and an output coupled to the control electrode of transistor 15.

Input buffer 10 thus offers a speed/power improvement by reducing power and providing for increasing the speed to compensate for the potential loss in speed caused by the power reduction.

I claim:

1. A TTL to CMOS input buffer comprising:
   a first P channel transistor having a control electrode for receiving a TTL signal, a first current electrode coupled to a first power supply terminal, and a second current electrode;
   a second N channel transistor having a control electrode coupled to the control electrode of the first transistor, a first current electrode coupled to the second current electrode of the first transistor, and a second current electrode coupled to a second power supply terminal;
   a third P channel transistor having a first current electrode coupled to the first power supply terminal, a second current electrode coupled to the second current electrode of the first transistor, and a control electrode; and
   signal coupling means for coupling the TTL signal to the control electrode of the third transistor in response to the TTL signal switching from a logic high to a logic low.

2. The input buffer of claim 1 wherein the
   first transistor has a first gain, and the second transistor has a second gain, said second gain being greater than said first gain.

3. The input buffer of claim 2 further comprising an amplifier circuit having an input coupled to the second current electrode of the first transistor, and an output coupled to the signal coupling means.

4. The input buffer of claim 3 wherein the signal coupling means comprises a fourth N channel transistor having a control electrode coupled to the output of the amplifier circuit, a first current electrode for receiving the TTL signal, and a second current electrode coupled to the control electrode of the third transistor.

5. The input buffer of claim 4 further comprising a fifth P channel transistor having a control electrode coupled to the output of the amplifier circuit, a first current electrode coupled to the first power supply terminal, and a second current electrode coupled to the control electrode of the third transistor.

6. The input buffer of claim 5 wherein the amplifier circuit comprises:
   a first CMOS inverter having an input as the input of the amplifier circuit coupled to the second current electrode of the first transistor, and an output; and
   a second CMOS inverter having an input coupled to the output of the first inverter, and an output as an output of the amplifier circuit coupled to the control electrodes of the fourth and fifth transistors.

7. The input buffer of claim 2 wherein the third transistor has a relatively high gain.

8. In a TTL to CMOS input buffer having a CMOS inverter, coupled between a first power supply terminal and a second power supply terminal, for receiving a TTL signal on an input and having an output for providing an output signal complementary to the logic state of the TTL signal, a method comprising the steps of:
   providing a switch circuit between the first power supply terminal and the output of the inverter, said switch circuit having an input which controls the operation of said switch circuit; and
   coupling the TTL signal to the input of the switch in response to the TTL signal switching from a logic high to a logic low.

* * * * *